(12) United States Patent
Tsai et al.

(10) Patent No.: US 7,653,890 B2
(45) Date of Patent: Jan. 26, 2010

(54) MODELING RESOLUTION ENHANCEMENT PROCESSES IN INTEGRATED CIRCUIT FABRICATION

(75) Inventors: Chi-Ming Tsai, Sunnyvale, CA (US);
Lai-Chee Man, Sunnyvale, CA (US);
Yao-Ting Wang, Sunnyvale, CA (US);
Fang-Cheng Chang, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 11/096,469

(22) Filed: Apr. 1, 2005

(65) Prior Publication Data

US 2005/0268256 A1    Dec. 1, 2005

Related U.S. Application Data

(60) Provisional application No. 60/559,267, filed on Apr. 2, 2004, provisional application No. 60/653,245, filed on Feb. 14, 2005.

(51) Int. Cl.
*G06F 17/50* (2006.01)
*G06F 9/455* (2006.01)

(52) U.S. Cl. .............................. 716/11; 716/19; 716/20; 716/21

(58) Field of Classification Search .................... 716/4, 716/19–21, 2, 11
See application file for complete search history.

(56) References Cited

U.S. PATENT DOCUMENTS

| | | | |
|---|---|---|---|
| 2002/0133801 A1* | 9/2002 | Granik et al. | 716/21 |
| 2003/0229412 A1* | 12/2003 | White et al. | 700/121 |
| 2004/0052411 A1* | 3/2004 | Qian et al. | 382/144 |
| 2004/0083439 A1* | 4/2004 | Pierrat et al. | 716/2 |
| 2004/0170905 A1* | 9/2004 | Liebmann et al. | 430/5 |
| 2004/0172609 A1* | 9/2004 | Hassibi et al. | 716/18 |
| 2005/0034087 A1* | 2/2005 | Hamlin et al. | 716/3 |
| 2005/0076322 A1* | 4/2005 | Ye et al. | 716/20 |
| 2005/0091013 A1* | 4/2005 | Gallatin et al. | 703/2 |
| 2005/0185159 A1* | 8/2005 | Rosenbluth et al. | 355/53 |
| 2005/0273753 A1* | 12/2005 | Sezginer | 716/21 |

* cited by examiner

*Primary Examiner*—Sun J Lin
*Assistant Examiner*—Suresh Memula
(74) *Attorney, Agent, or Firm*—Sheppard Mullin Richter & Hampton LLP (57) ABSTRACT

A Wafer Image Modeling and Prediction System ("WIMAPS") is described that includes systems and methods that generate and/or apply models of resolution enhancement techniques ("RET") and printing processes in integrated circuit ("IC") fabrication. The WIMAPS provides efficient processes for use by designers in predicting the RET and wafer printing process so as to allow designers to filter predict printed silicon contours prior to application of RET and printing processes to the circuit design.

20 Claims, 7 Drawing Sheets

MODELING RESOLUTION ENHANCEMENT PROCESSES IN INTEGRATED CIRCUIT FABRICATION

RELATED APPLICATION

This application claims the benefit of U.S. provisional Patent Application Nos. 60/559,267, filed Apr. 2, 2004, and 60/653,245, filed Feb. 14, 2005.

TECHNICAL FIELD

The disclosure herein relates generally to fabricating integrated circuits. In particular, this disclosure relates to systems and methods for manufacturing integrated circuit devices or chips.

BACKGROUND

The need to manufacture integrated circuits ("IC") at dimensions ever closer to the fundamental resolution limits of optical lithography systems has made resolution enhancement technologies ("RET") an integral part of the strategic lithography road map for most very-large-scale integrated ("VLSI") circuit manufacturers. No longer considered research oriented lithography tricks, these techniques are improving lithography process windows to a point where the current pace of chip integration can be maintained until non-optical lithography solutions become feasible. Along with these improvements come increased complexity at all levels of the IC manufacturing process, and these complexities impact many aspects of chip layout and mask manufacturing as well as wafer processing and characterization.

In current manufacturing processes, the application of RET (e.g., Off Axis Illumination ("OAI"), Optical Proximity Correction ("OPC"), Phase-Shifting Masks ("PSM")) to sub-wavelength designs has become a necessary part of manufacturing following tapeout. The RET is necessary in order to make sure that the lithographically printed shapes are as close as possible to the originally targeted, designed layout shapes. However, as a result, design verification processes prior to tapeout have no visibility into whether the designed shapes will actually reach shape closure (the actual design is achieved on silicon), or are RET-able, or manufacturable.

In order to assure shape closure through detail simulation of lithographic processes at the tapeout stage before providing a design to a fabrication facility ("Fab") or foundry, detail process models and RET recipes of the Fab must be disclosed to the circuit designers for use in RET analysis before tapeout. The lithographic processes include shape-patterning steps, which include for example mask manufacturing, optical exposure, photo resist and other films, resist development, de-scum, etching, chemo-mechanical polishing ("CMP"), etc. While this is expensive from a computational point of view, it is also difficult to achieve logistically because the Foundries typically view the detail modeling and recipes as proprietary information (and Fabs, cumbersome) and therefore are unwilling to disclose such detailed lithographic and manufacturing capabilities. In addition, the designers are unwilling at and incapable of dealing with the complexity and understanding the physics that constraint the design on silicon. Therefore, conventional design verification rules are typically the only means available for use in verifying manufacturability by the way of design rule checking. As such, the state of IC manufacturing is degenerating to a situation where the conventional paradigm and wisdom of rules and heuristics alone can no longer be effective at predicting shape manufacturability. In addition, certain shapes or parts of layout cannot be guaranteed "RET-able" by any of the tools in the conventional design flow. Consequently, there is a need for a tool that enables circuit designers to predict and determine the RET-ability or lithographic manufacturability of a circuit design layout prior to providing the design to the foundry.

Incorporation by Reference

Each publication and patent application mentioned in this specification is herein incorporated by reference in its entirety to the same extent as if each individual publication or patent application was specifically and individually indicated to be incorporated by reference.

BRIEF DESCRIPTION OF THE DRAWINGS

In the drawings, the same reference numbers identify identical or substantially similar elements or acts. To easily identify the discussion of any particular element or act, the most significant digit or digits in a reference number refer to the Figure number in which that element is first introduced (e.g., element 100 is first introduced and discussed with respect to FIG. 1).

DETAILED DESCRIPTION

Systems and methods for generating lumped models of resolution enhancement techniques ("RET") and printing processes in integrated circuit ("IC") fabrication are described below. The systems and methods for generating the lumped models, also collectively referred to herein as the Wafer Image Modeling and Prediction System ("WIMAPS"), provide efficient processes for use by designers in simulating the RET and wafer printing process, thereby allowing designers to predict printed silicon contours.

In the following description, numerous specific details are introduced to provide a thorough understanding of, and enabling description for, embodiments of the WIMAPS. One skilled in the relevant art, however, will recognize that these embodiments can be practiced without one or more of the specific details, or with other components, systems, etc. In other instances, well-known structures or operations are not shown, or are not described in detail, to avoid obscuring aspects of the disclosed embodiments of the WIMAPS.

In order to provide designers the ability to predict and determine the lithographic manufacturability, or RET-ability, of an IC layout, the WIMAPS may be inserted into the pre-tapeout verification flow or other insertion point of the cell design process, after floorplanning, placement, or routing. The WIMAPS provides chip designers with an abstraction of the downstream manufacturing process based on the fundamental physics (e.g., any simulation or modeling) of the manufacturing process. The WIMAPS therefore predicts for the designer the downstream RET-ability with a particular level of accuracy relative to actual RET results. At one end of the prediction spectrum, the WIMAPS abstraction can be as close to the detailed simulation/modeling as possible (e.g., using modular transfer functions or any empirical representation of the imaging systems, or even the detail simulation model itself). Alternatively, the WIMAPS can be an interpolated/extrapolated model of the DRC rule decks recognizing the optical/lithographic behavior (e.g., using OPC segmentations as the criteria), or another level of complexity between the ends of the prediction spectrum.

In considering an abstraction that is close to the detailed simulation/modeling, the WIMAPS may use information of processes of a Fab, where the Fab is the foundry that will be printing the wafers. The WIMAPS uses the process information to perform simulations on the actual layout or to generate a detailed lookup table for use in critiquing the RET-ability or degree of shape closure on the design. For example, the WIMAPS may use process information that includes representative Modular Transfer Functions (MTF) (e.g., the frequency response partially representing the physical lithography phenomenon) to assess the printing quality. Additional sensitivity analysis (e.g., sensitivity to process variation such as depth of focus or other physical and non-physical parameters) can also be used to act as a "RET-ability" or lithographic manufacturability detector. Alternatively, the WIMAPS of an embodiment may model the detailed lithographic predictability using an empirical model (or semi-empirical based on fundamental physics of the imaging system) in which a calibration technique provides an accuracy level specific to a particular Fab process. Regardless of the model used by the WIMAPS, the model is trained using one or more of empirical, semi-empirical, physical, and rules information.

In considering the interpolated/extrapolated model of the DRC rule decks, the WIMAPS uses the DRC rules as a foundation in combination with any modeling behavior to geometrically compose the resulting critiques/indices per geometry or portion of geometry. The modeling behavior may include proximity distance, degree of coherence, and OPC segmentation setups for example, but is not so limited.

The WIMAPS therefore provides the designer with a novel system for use in modeling and predicting the manufacturability (lithographic, etching, CMP, etc.) of chip layouts without having to go through the exact manufacturing flow. The modeling and predicting of the WIMAPS may be based on an abstraction that is very close to detailed simulation/modeling as described above, and/or may be based on a system of equations representing the downstream manufacturing process. For example, a designer may use a first WIMAPS based on the solution to an optimization problem to evaluate a complete chip design followed by use of a second WIMAPS based on detailed simulation/modeling to evaluate suspect locations of the chip design identified through application of the first WIMAPS. As another example, the first and second WIMAPS may also be used in order to complement each other's deficiencies with respect to use on a particular design. The WIMAPS also provides the designer with a system that repairs or fixes errors detected in the design as a result of the modeling and prediction so as to improve the manufacturability of the chip layout.

Figure 1:
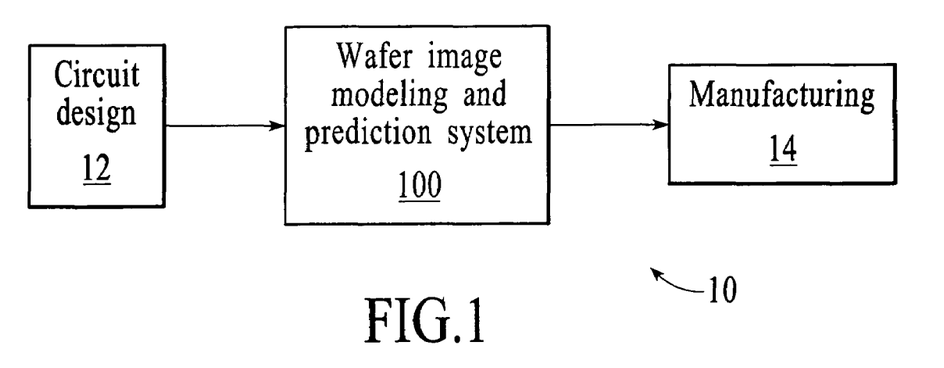
FIG. 1 is a block diagram of an integrated circuit ("IC") design and manufacturing process that includes the Wafer Imaging Modeling and Prediction System ("WIMAPS"), under an embodiment.

FIG. 1 is a block diagram of an IC design and manufacturing process 10 that includes the Wafer Imaging Modeling and Prediction System ("WIMAPS") 100, under an embodiment. The WIMAPS receives the circuit design 12 as an input, and provides a RET-able or manufacturable circuit design as an output to manufacturing 14, therefore reducing or eliminating errors in chip manufacturing resulting from design-to-silicon errors.

The WIMAPS of an embodiment is inserted into the pre-tapeout verification flow or other insertion point of the chip design process, after placement and routing for example. In the chip manufacturing process, a circuit design is subject to RET, a process which results in generation of a mask for use in fabrication. The mask undergoes one or more optical lithography processes and is printed on silicon. Fabrication facilities use a wafer printing model in order to tune lithography processes by simulating how well the patterns print. The WIMAPS provides efficient processes for use by designers in simulating the RET and wafer printing process, thereby allowing designers to predict printed silicon contours. There are many different RET processes available, all having the common goal of compensating for printing imperfections (e.g., blurring, etc.). Instead of providing a detailed simulation of the RET and wafer printing process, the WIMAPS predicts the RET-ability of a design by modeling the RET and/or wafer printing processes as a non-unique inversion of the RET and/or wafer printing processes.

The WIMAPS of an embodiment uses information of a fab's wafer printing process to model the wafer printing process. The WIMAPS of an embodiment therefore uses information of at least one optical process (e.g., conventional illumination, off-axis illumination, immersion lithography, polarized light, etc.), resist development process, and/or etching process to model the wafer printing process.

Figure 2:
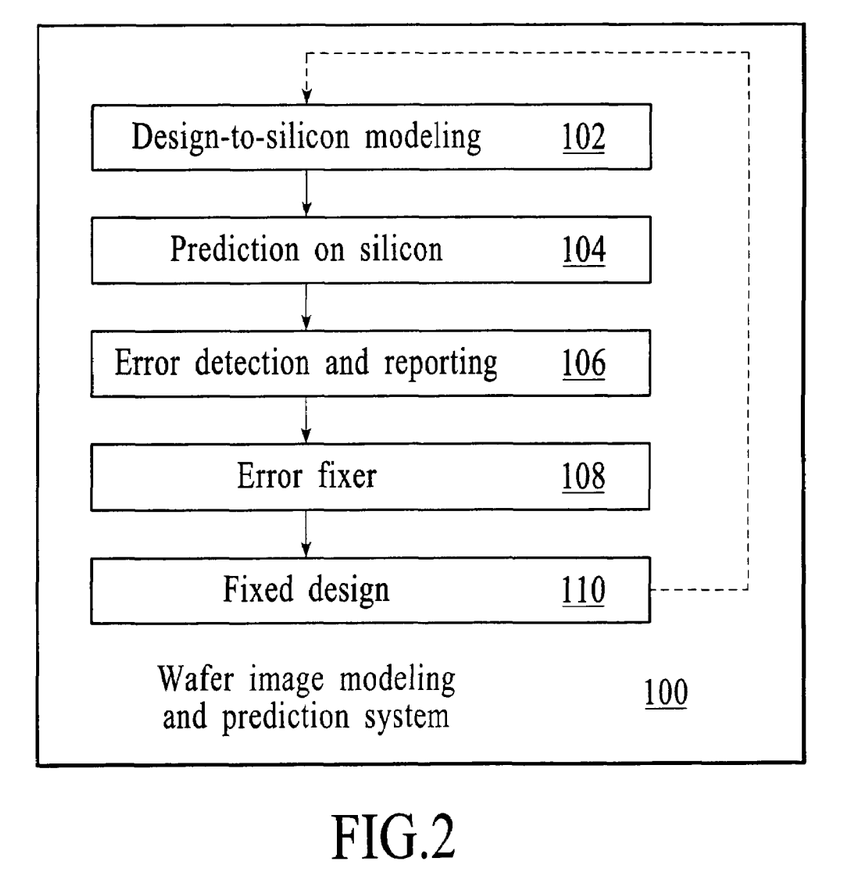
FIG. 2 is a block diagram of the WIMAPS, under an embodiment.

FIG. 2 is a block diagram of the WIMAPS 100, under an embodiment. The WIMAPS can be inserted anywhere in the design flow involving physical designs. The WIMAPS 100 includes design-to-silicon modeling 102, prediction on silicon 104, error detection and reporting 106, and error repair or fixing 108 components or processes. A RET-able or manufacturable design 110 (also referred to as the "fixed design" 110) results from processing a circuit design using one or more processes of the WIMAPS 100 alone or in at least one combination. While the components 102-108 of WIMAPS 100 are shown as coupled in a sequence, the embodiment is not limited to this sequence or flow. Consequently, the various components 102-108 may be used alone or in various combinations in a chip design/manufacturing process flow. Furthermore, while one or more of the design-to-silicon modeling 102, prediction on silicon 104, error detection and reporting 106, and error repair or fixing 108 components may be components of the design process, the WIMAPS 100 is not limited to this process flow as any of these processes 102-108 can be components of any other part of the IC fabrication process.

As electronic circuit designers generally rely upon computer programs to assist and automate the circuit design process because the circuits typically contain a very large number of individual pieces (also referred to as "cells"), the WIMAPS 100 may include or couple with one or more components of an EDA system or other electronic system used to automate the circuit design and fabrication of IC devices, but is not so limited. Therefore, while the description herein refers to the WIMAPS 100, it is understood that the WIMAPS components 102-108 may function as independent components each coupled alone or in one or more different combinations to components or component processes of one or more EDA systems known in the art.

The WIMAPS of an embodiment uses information of a designed circuit layout to generate one or more equations. The equations model or describe an interaction (but not limited to the specified formulation) between the manufacturing (e.g., lithographic) process and circuit layout (e.g., contribution of surrounding OPC biases circumscribing the layout on any given point in the layout). Information from the model is then used during the IC design process to predict the wafer image/results without actually attempting to solve (or completely solving) the equations and/or printing the image. Information of the predicted wafer image is used during the design process to verify and/or modify the circuit layout to meet pre-specified image printing/manufacturing criteria prior to tapeout or other manufacturing processes. One example of the WIMAPS is available as the InShape™ or ShapeClosure™ products available from Clear Shape Technologies, Inc. of Sunnyvale, Calif.

Additionally, the predicted wafer image resulting from the WIMAPS may be used in the RET/printing process during manufacturing to provide improved results. Thus, the WIMAPS also provides an effective and precise method to directly arrive at RET in a more systematic, efficient, and accurate manner.

The WIMAPS also allows for combining information of the estimated RET and/or the printing process to form an integrated system that can predict wafer image without having to execute the detailed (iterative, conventional and heuristics-based) RET and printing processes. This combined model is simple and efficient and enables circuit designers to evaluate designs with the model. This combined model therefore provides one or more of the following, but is not so limited: performing fast OPC with better output quality; performing more robust OPC by using an optimal dissection; estimating the difficulties of OPC without actually performing OPC; identifying locations in a circuit layout that cannot be OPC corrected; identifying locations where the printed shape is sensitive to dissection; identifying locations in a circuit layout that can be corrected under pre-specified conditions, but where the image quickly deteriorates as the printing conditions deviate from ideal case (e.g., throughout the process window); iterative refinement of the RET process; other predictive behavior relating to the circuit layout; other post tapeout RET-based or silicon-simulation-based process (es) (e.g, simulation-based verification of RET); other manufacturing processes similar to the RET/printing flow requiring pre-tapeout predictive behavior from layout (e.g., etching, CMP, yield curve/map modeling). The WIMAPS can further be used in conjunction with assist features, alternating PSM, and other RET techniques, but is not so limited.

Referring again to the WIMAPS 100 (FIG. 2), the design-to-silicon modeling 102 is coupled to receive a circuit design as an input. The design-to-silicon model 102 generates silicon contours as output by modeling the effects of the RET and/or printing process but does not attempt to produce the discrete (typically binary) mask resulting from the RET process, although alternative embodiment may produce a mask. Further, because the WIMAPS process is not required to produce a mask, the process uses a lumped model of the inverse RET model and the wafer printing model for direct simulation from design to silicon with an optional intermediate product (mask or any representation of the mask, e.g., layout, fractured results, inspected image, simulated image, etc.).

Figure 3:
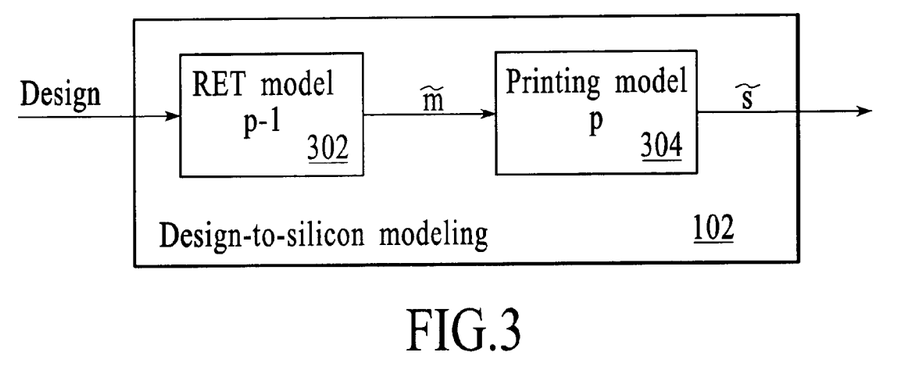
FIG. 3 is a block diagram of the design-to-silicon modeling, under an embodiment.

FIG. 3 is a block diagram of the design-to-silicon modeling 102, under an embodiment. The design-to-silicon modeling 102 of an embodiment is a "lumped model" that models the RET process and the wafer printing process. The RET model 302 outputs a non-discrete continuous function instead of a discrete binary mask, although a mask may also be produced. The lumped model of the WIMAPS includes processes to characterize the behavior of the RET and wafer printing processes of the conventional VLSI production flow. The RET process characterized by the WIMAPS may be any of a number of processes known in the art including but not limited to any number of OPC processes and any number of PSM processes.

The WIMAPS of an embodiment generates the lumped design-to-silicon model using optimization that includes minimization of the differences between the lumped model and the identity (circuit design). As such, the WIMAPS formulates the model as an optimization problem with many different possible constraints to help in identifying a better model. As one example, one possibility is to produce an estimated mask that is as close as possible to a realizable mask. In so doing the model is constrained using error weighting so that little error is allowed in the estimated mask in areas of the mask that are removed from the edges while relatively more error is allowed in the estimated mask in areas of mask edges. The model may be further calibrated to a particular Fab process. Fab uses test layouts produced using the lumped model to produce test prints of printed contours.

A circuit design layout is typically subject to RET before being written onto a mask and sent to a wafer printing process. The printing process, which often involves optical exposure, post-exposure resist development, and chemical etching, is known in the art. Models of the RET and printing process have been proposed and are in wide-spread use. These models of the RET and printing processes are generally referred to herein as "model P" or "P". The WIMAPS of an embodiment calibrates the model P by tuning the parameters of the model P to match the model's output to the printed contours of a set of test patterns. The RET process characterized by the WIMAPS may be any number of processes known in the art that in general alter the circuit layout on the mask to pre-compensate for printing distortions introduced by the lithography system. Consequently, the RET process characterized by the WIMAPS includes various techniques such as model-based OPC ("MOPC"), sub-resolution assist feature (SRAF), also known as scattering bars (SB), alternating phase shift mask ("Alt PSM"), attenuating phase shift mask ("Att PSM"), and chromless PSM to name a few.

The design-to-silicon modeling 102 of an embodiment models the RET as an inverse of the RET model P, thereby replacing the internal RET by an effective RET model that is an approximate inverse of the model P. The inverse model is referred to herein as "$P^{-1}$", where "~" indicates an approximate inverse, since P is in general not exactly invertible. The design-to-silicon modeling 102, in addition to requiring less than the full RET details, which are often not completely available, is such that $P^{-1}$ and P can be lumped together to form a single overall model "G" of the design-to-silicon flow, where $G=P*P^{-1}$. The lumped model G enables fast simulation of the silicon contour given the design.

The output of the inverse model $P^{-1}$ is an approximation of the actual mask "m" of the conventional design process, and the approximate mask is referred to herein as mask "m". While the actual mask m is generally a binary function taking on values of 0 or 1 (or a small set of discrete values such as −1, 0, 1 in the case of alt PSM, and −t, 1 in the case of att PSM, t being the amplitude of transmission), the estimated mask m is not necessarily restricted in this way and in general is a continuous function of position.

An example of the design-to-silicon modeling 102 of an embodiment follows that includes MOPC as the RET being modeled, but the design-to-silicon modeling 102 is not so limited. In this example, the design-to-silicon modeling 102 of an embodiment determines $P^{-1}$ by casting $P^{-1}$ as the solution to the following optimization problem:

$$\min \|P*P^{-1}-I\|,$$

where "I" denotes the identity operator and $\|\cdot\|$ a suitably defined norm. This unconstrained optimization procedure generally yields mask approximations that are quite different from any realizable masks and hence may not describe any actual RET process. Therefore, a solution is arrived at by constraining m. For example, terms can be added to the optimization to ensure that m is close to the input circuit design everywhere except near the circuit layout polygon edges, thus reflecting the fact that OPC generally only alters the design near the edges. The constraint term that constrains is added to the cost function as $$\|m-d\|_w,$$

where "W" indicates a spatial weighting which is large some distance away from the polygon edges and small near edges of the design. Additionally, the design-to-silicon model regularizes the solution by penalizing inherently unstable inverse models, for example, models in which $$\mathrm{norm}\|P^{-1}\|\equiv\max_v\|P^{-1}v\|/\|v\|$$

is large. Hence the new cost function to optimize is $$\min\|P*P^{-1}-I\|+\mu_1\|P^{-1}d-d\|_w+\mu_2\|P^{-1}\|,$$

where "$\mu_1$" and "$\mu_2$" are relative weightings.

The solution $P^{-1}$ gives a model of an ideal realizable OPC performed on a typical circuit design layout. To further calibrate the design-to-silicon model to a particular RET process (e.g., a specific MOPC of a specific fab), the design-to-silicon model 102 of an embodiment uses printed silicon contours (or critical dimension measurements) to refine the model. The printed silicon contours are received or produced from a pre-designed set of test layouts "d" but are not so limited. Under this scenario the design-to-silicon modeling produces the $P^{-1}$ that best matches the fab's RET behavior using an additional term such as $$\mu_3\|P*P^{-1}d-s\|$$

in the cost function described above. This additional term when used in the cost function penalizes differences between the contour predicted from the design-to-silicon model and the actual silicon contour "s" and provides a new cost function as $$\min\|P*P^{-1}-I\|+\mu_1\|P^{-1}d-d\|_w+\mu_2\|P^{-1}\|+\mu_3\|P*P^{-1}d-s\|.$$

Various alternative embodiments of the design-to-silicon model may include additional cost function terms for the purpose of further regularizing the solution as appropriate to the RET or other fab processes. Other regularization or constraints can be added, for example, to reduce manufacturing rule check violations, such as other geometric constraints, or objective function(s) relating to the cost or performance of the mask/process.

Process variations such as exposure dose fluctuations and uneven focus across the field and through the resist layer are inevitable in actual wafer printing processes. As a result, to fully characterize the printing behavior, multiple printing models $P_i$ may be used. These models may be derived, for example, by changing the values of one or more parameters of the nominal model P based on their possible physical interpretation (e.g., defocus, exposure, etc.), or from additional data fitting if the silicon contours $s_i$ of the test patterns under multiple process conditions are provided by the fab. If the fab's RET (e.g., MOPC) is optimized over these multiple process conditions, the design-to-silicon modeling of an embodiment can model it by expanding terms including, but not limited to, $$\|P*P^{-1}-I\|$$

and $$\|P*P^{-1}d-s\|$$

to cover the multiple printing models. The design-to-silicon model terms are therefore expanded as $$\min\Sigma_i\alpha_i\|P_i*P^{-1}-I\|+\mu_1\|P^{-1}d-d\|_w+\mu_2\|P^{-1}\|+\mu_3\Sigma_i\beta_i\|P_i*P^{-1}d-s_i\|,$$

where the $\alpha_i$ and $\beta_i$'s are the relative weightings of the various process window conditions. On the other hand, if the MOPC is performed under nominal printing conditions, only one term is included in each of the summations of an embodiment. Once $P^{-1}$ is found, it is used or combined with the various $P_i$'s to generate multiple design-to-silicon models which may be used to predict the silicon contour sensitivity to different process window conditions using estimated silicon contours $\tilde{s}$.

An example is described below using the design-to-silicon modeling of an embodiment to find $P^{-1}$ in the case of a coherent point source illumination. Under such a condition, the printing model may be obtained using the equation $$\mathrm{Intensity}(x,y)=|\int_{-\infty}^{\infty}h(x-x',y-y'),d(x',y')dx'dy'|^2,$$

and replacing the intensity threshold by an equivalent amplitude threshold. The result is a discrete linear shift invariant system in which P becomes a block Toeplitz matrix. The design-to-silicon modeling of an embodiment minimizes the cost function as $$\min\|P*P^{-1}-I\|+\mu\|P^{-1}\|.$$

The singular value decomposition of P, denoted by $\Sigma_i\sigma_i u_i v_i^\dagger$, results in $$P^{-1}=\Sigma_i\kappa_i v_i u_i^\dagger,$$

where $$\kappa_i=\sigma_i/(\sigma_i^2+\mu^2).$$

The lumped design-to-silicon model is therefore $$PP^{-1}=\Sigma_i\sigma_i^2 u_i u_i^\dagger/(\sigma_i^2+\mu^2)$$

and a direct simulation of the contour s given a circuit design layout results without first calculating the intermediate value m.

Figure 4:
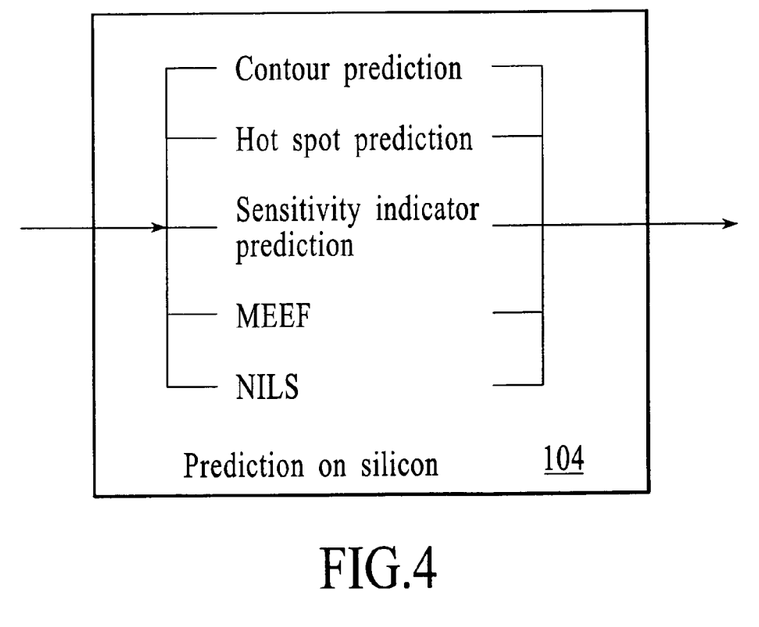
FIG. 4 is a block diagram of the prediction on silicon, under an embodiment.

The WIMAPS 100 outputs the result (e.g., estimated silicon contours $\tilde{s}$) of the design-to-silicon modeling 102 to the prediction on silicon 104. FIG. 4 is a block diagram of the prediction on silicon 104, under an embodiment. The prediction on silicon component or processes 104 produce or generate predictions of at least one factor relating to the circuit design. The predicted factors include but are not limited to at least one of contour predictions, hot spot predictions, sensitivity predictions, Mask Error Enhancement-Factor ("MEEF") predictions, process window predictions, and normalized image log-slope ("NILS") predictions. The results of the prediction on silicon processes 104 are provided as an output.

Figure 5:
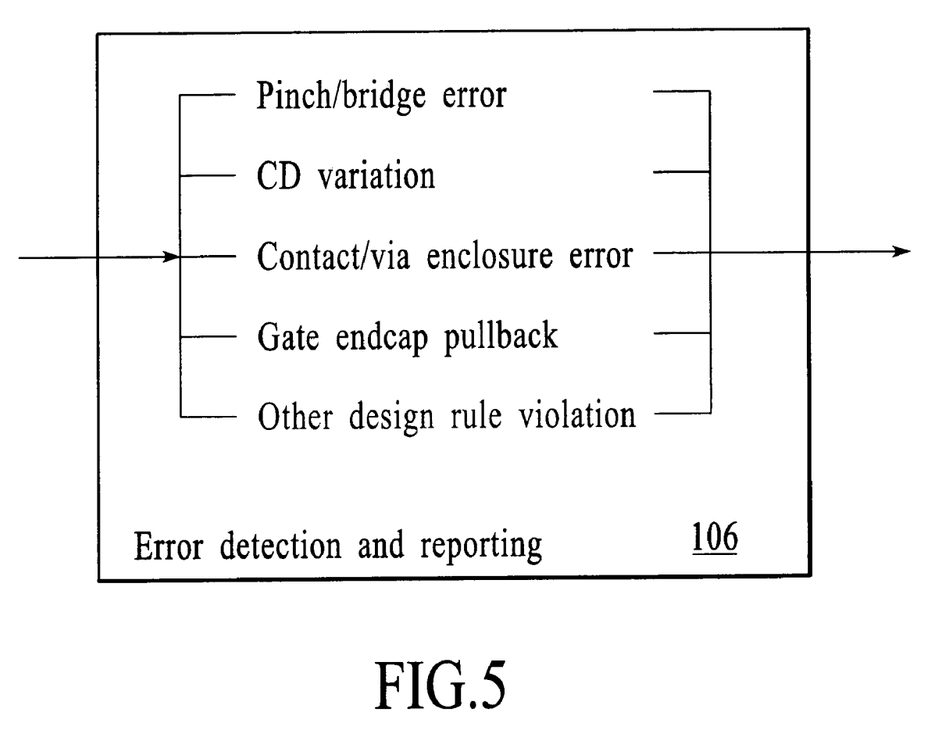
FIG. 5 is a block diagram of the error detection and reporting, under an embodiment.

The WIMAPS 100 outputs the results of the prediction on silicon processes 104 to the error detection and reporting component or processes 106. FIG. 5 is a block diagram of the error detection and reporting 106, under an embodiment. The predicted silicon results from the prediction on silicon processes 104 are further processed using one or more error detection processes in order to identify errors in a design. For example, the error detection and reporting of an embodiment may evaluate the design for pinch/bridge errors, critical dimension ("CD") variations that are excessive, contact/via enclosure errors, gate endcap pullback errors, and/or other design rule violations (e.g., design rules checked before tape-out in the silicon domain).

The output of the error detection and reporting 106 can be directly output for use by a user. The outputs can be a text file listing the locations, severity and type of errors. The outputs may also include markers stored on a different layer of the layer file so that the user can see the layout 100 and the error markers on a layout browser at the same time. Different types can errors can be stored on different layers and the size of markers can indicate the severity of the errors.

Figure 6:
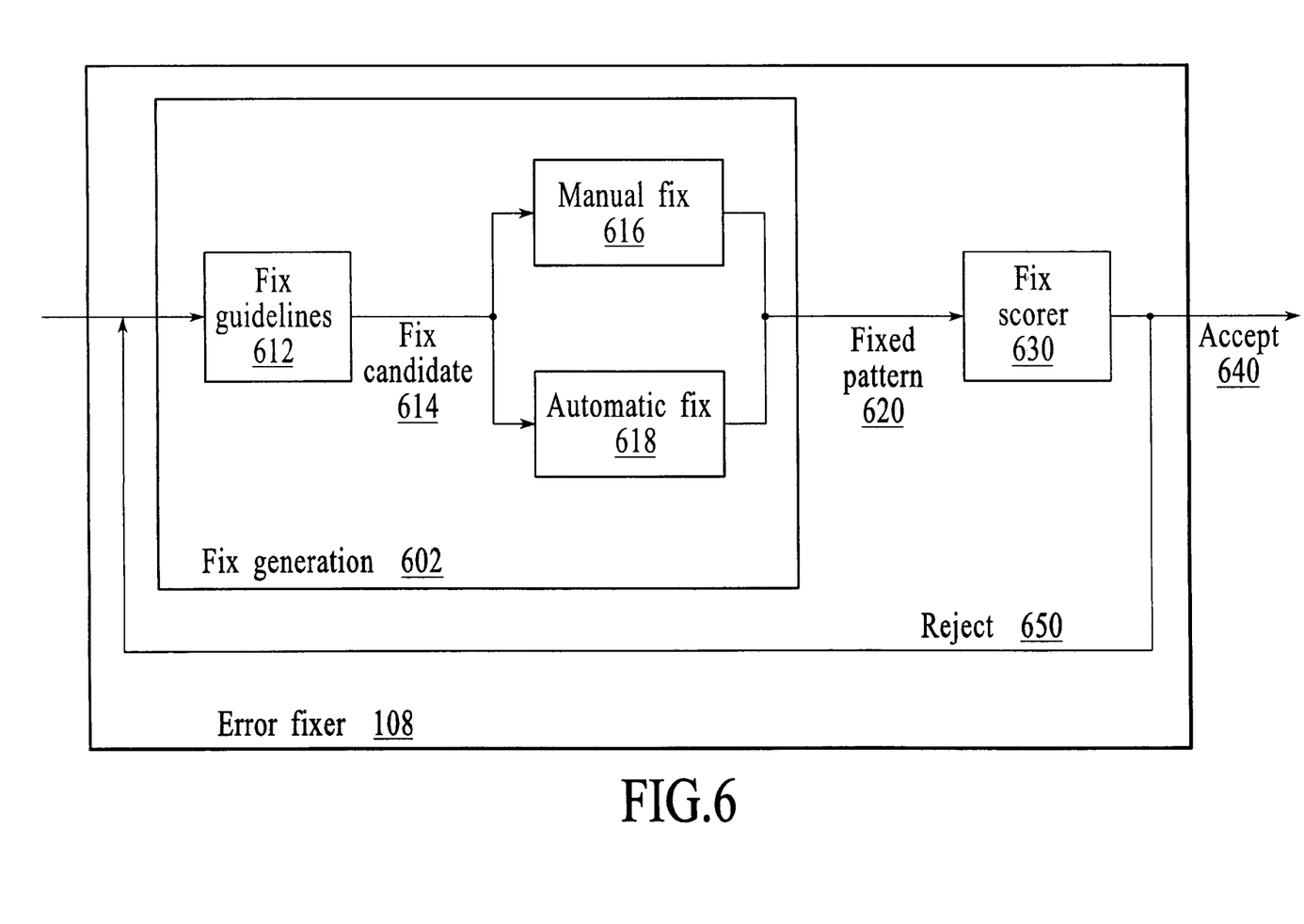
FIG. 6 is a block diagram of the error fixer, under an embodiment.

The WIMAPS 100 outputs the results of the error detection and reporting processes 106 to the error repair or error fixer component or processes 108. FIG. 6 is a block diagram of the error fixer 108, under an embodiment. The error fixer 108 of an embodiment includes a fix or repair generation component or process 602, also referred to as the "fix generator 602" or "repair generator 602", coupled to a fix scorer 630, but is not so limited.

The fix generator 602 may use information of the errors reported by the error detection and reporting 106 to generate fix guidelines 612 for use in producing fix candidates 614 that are used to generate one or more fixed patterns 620. Alternatively, the fix generator 602 may generate fix candidates 614 based on the type of errors reported by the error detection and reporting 106 and outputs one or more fixed patterns 620 to the fix scorer 630, which scores or rates each fixed pattern 620. Additionally, the fix generator 602 may generate guidelines and fix candidates as described above.

The fix generator 602 of an embodiment generates fix guidelines 612 using information of errors detected in the circuit design and the design-to-silicon model produced by the design-to-silicon modeling 102. The fix guidelines 612 may include guidelines by which the fix candidate is design-rule compliant, does not affect the functionalities of the circuit (e.g., breaking a polygon, bridging two polygons, etc.), and/or minimizes impacts to circuit performance. Examples of fix candidates 614 include, but are not limited to, increasing width and spacing, increasing contact/via enclosures, increasing the length/area of gate endcaps, flipping a cell, and replacing one cell with another cell that has the same functionalities.

The fix generator 602 also calculates the impact of each segment or portion of neighboring geometry on detected errors using information of the design-to-silicon model. The impact of neighboring geometry on detected errors is categorized into at least one of alleviating the error, worsening the error, and/or not relevant. Given the resulting fix candidates 614, the fix generator 602 provides a user with one or more manual fix processes 616 for manually editing a circuit layout using the fix candidates and/or an automatic fix process 618 that automatically applies the fix candidates 614 to the circuit layout. Alternative embodiments of the WIMAPS may include only the manual fix component 616 or the automatic fix component 618.

Figure 7:
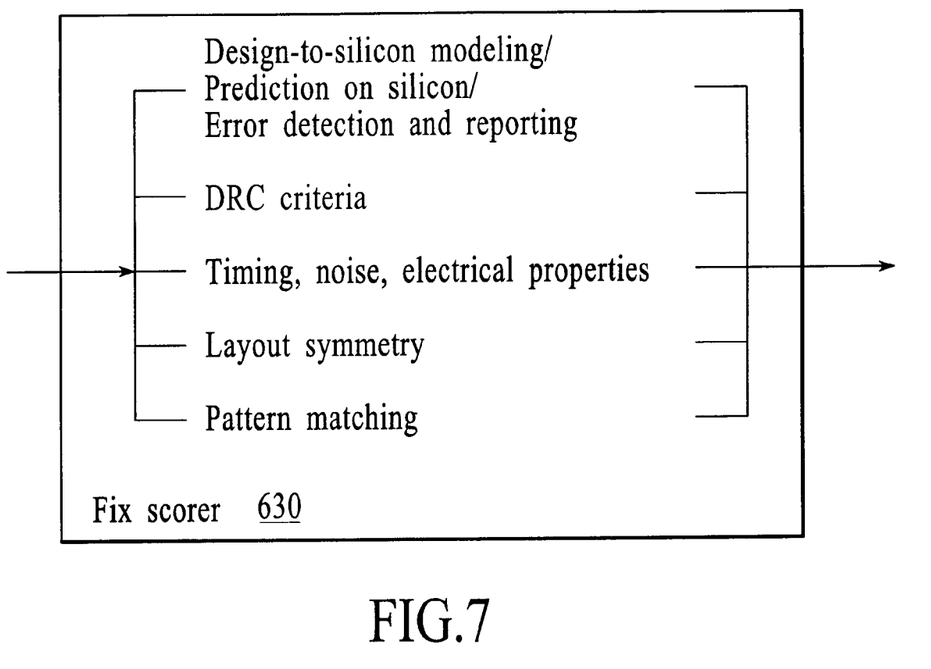
FIG. 7 is a block diagram of the fix scorer, under an embodiment.

The fix generator 602 is coupled to provide an output to the fix scorer 630, where the output includes fixed patterns 620. FIG. 7 is a block diagram of the fix scorer 630, under an embodiment. The fix scorer 630 evaluates and compares the fix candidates of the fixed patterns 620 and decides whether the fixed pattern 620 is acceptable. If a fixed pattern 620 is determined to be acceptable, then the corresponding fix candidate is accepted by the fix scorer 630 and the fixed pattern 620 is output 640 as a fixed design 110 (FIG. 1). If a fix candidate is rejected by the fix scorer 630, the corresponding fixed pattern 620 is rejected and operation returns 650 to generate fix candidates 614 using one or more fix guidelines 612 as described above.

Each fix candidate 614 of an embodiment is not a unique fix for the corresponding detected error in the design. Therefore, the fix scorer 630 evaluates fix candidates 614 of each fixed pattern 620 and determines whether each fix candidate 614 is acceptable. The criteria for evaluating fix candidates 614 may include at least one of the design-to-silicon model 102, the prediction on silicon 104, the error detection and reporting 106, design rule compliance, electrical parameters of the circuit (e.g., timing, noise sensitivity, signal integrity (crosstalk), IR drop, power consumption, etc.), pattern symmetry, and pattern matcher evaluations, but are not so limited.

Referring again to FIG. 1, the WIMAPS 100 of an embodiment may return the fixed design 110 output from the error fixer 108 to the design-to-silicon modeling 102. The WIMAPS 100 then evaluates the fixed design 110 as described above. Alternatively, if no errors were detected in a circuit design by the error detection and reporting 106, the WIMAPS 100 may not perform additional processing on the fixed design 110.

Figure 8:
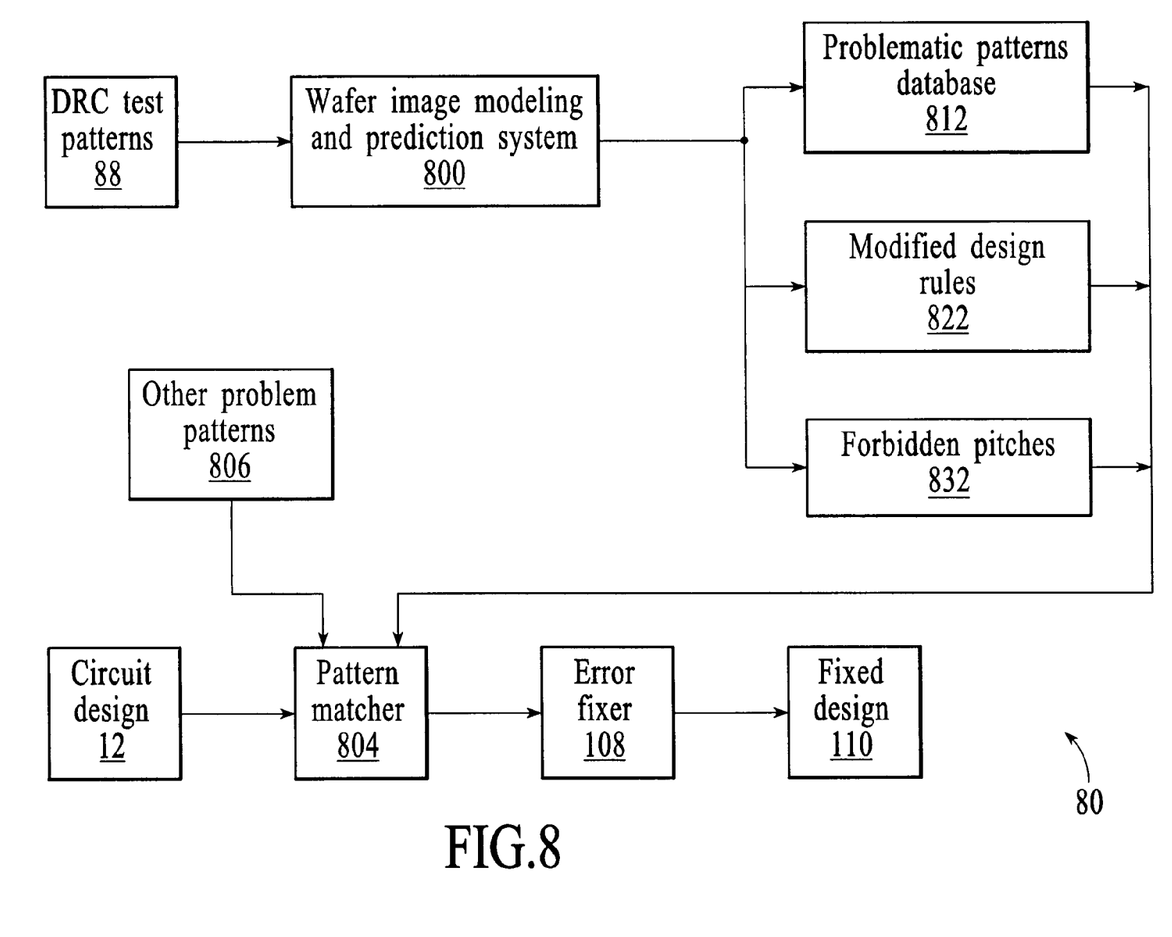
FIG. 8 is a block diagram of a rule-based checking process that includes the Wafer Imaging Modeling and Prediction System ("WIMAPS"), under an embodiment.
Figure 9:
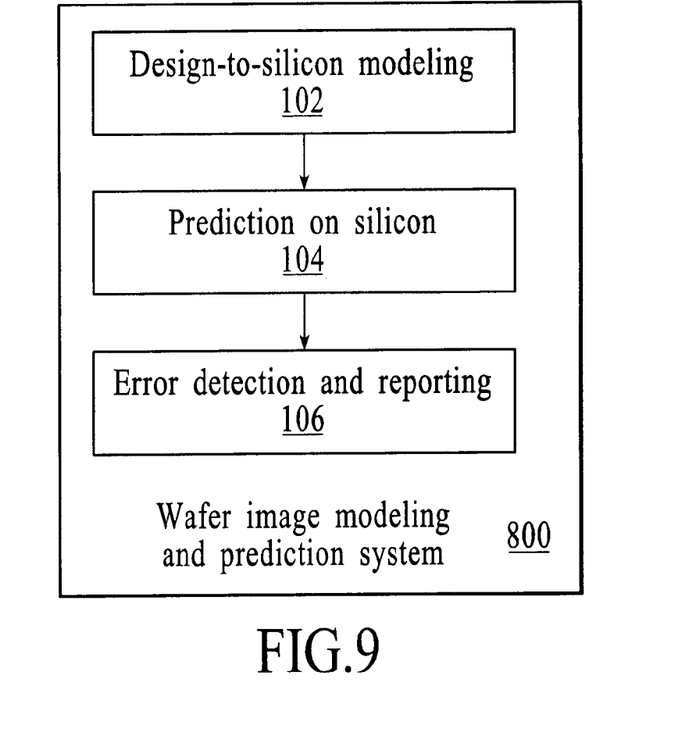
FIG. 9 is a block diagram of the WIMAPS, under an alternative embodiment.

The WIMAPS of an embodiment may also have additional applications. As one example, the WIMAPS detects and complements any deficiencies of rule-based checking of the IC fabrication process. FIG. 8 is a block diagram of a rule-based checking process 80 that includes the Wafer Imaging Modeling and Prediction System ("WIMAPS") 800, under an embodiment. FIG. 9 is a block diagram of the WIMAPS 800, under an embodiment. The WIMAPS 800 includes design-to-silicon modeling 102, prediction on silicon 104, and error detection and reporting 106 components or processes. The design-to-silicon modeling 102 is a lumped model that models the RET process and the wafer printing process as described above with reference to FIG. 3.

The design-to-silicon modeling 102 outputs its result (e.g., estimated silicon contours $\hat{s}$) to the prediction on silicon 104. The prediction on silicon component or processes 104 produce or generate predictions of at least one factor relating to the circuit design as described above with reference to FIG. 4. The predicted silicon results from the prediction on silicon processes 104 are further processed using one or more error detection and reporting processes 106 in order to identify errors in a design, as described above with reference to FIG. 5. While the components 102-106 of WIMAPS 800 are shown as coupled in a sequence, the embodiment is not limited to this sequence or flow. Consequently, the various components 102-106 may be used alone or in various combinations in a chip design/manufacturing process flow.

The WIMAPS 800 is used to test a number of design-rule compliant test patterns. As such, the rule-based checking process 80 includes the WIMAPS 800 coupled to receive design rule-compliant test patterns 88. The WIMAPS 800 evaluates the received test patterns 88 and transfers each evaluated pattern to a pre-specified component or process as appropriate to errors detected during the evaluation. For example, in response to particular errors detected by the WIMAPS 800, a design rule-compliant test pattern 88 is placed into a problematic pattern database 812. In another example, the process 80 refines or modifies 822 the design rules so that a particular pattern becomes illegal as a test pattern in response to errors detected by the WIMAPS 800. This provides a method for determining weaknesses in a design rule or set of design rules. Once identified, the weak design rules can be modified for better manufacturability, or eliminated from the design rule set.

In an additional example, the forbidden pitch is identified by 832 for a test pattern as a result of WIMAPS 800 error detection. This allows for future detection and prediction of forbidden pitches using the identified forbidden pitches.

A pattern matcher 804 is coupled to receive the circuit design 12 as well as information of the problematic pattern database 812, the modified design rules 822, and the forbidden pitches 832. The pattern matcher 804 is also coupled to receive other problematic test patterns 806 previously identified. The pattern matcher performs non-simulation based checking of the circuit design 12 in order to detect forbidden pitches, match problematic two-dimensional ("2D") patterns, and perform other rule-based checking. The pattern matcher 804 transfers errors detected in the circuit design to the error fixer 108. The error fixer 108 includes a fix generation component or process 602, also referred to as the "fix generator 602", coupled to a fix scorer 630, as described above with reference to FIG. 6, but is not so limited. The error fixer 108 outputs a fixed design 110 as described above.

The WIMAPS of an embodiment may also have additional applications. As one example, the WIMAPS predicts locations that are difficult to manufacture and/or apply RET. These locations info can be used to in the RET or post-RET verification stages to improve the quality of RET and/or to apply more sophisticated but computationally expensive verification methods to these locations.

Prior to any application of RET, and verification of correctness of the applied RET, a segmentation process may be introduced into the fabrication process for use in locating points in a circuit layout where the correction or verification simulation is evaluated. Iterated correction values (e.g., bias) or error flags may be assigned as a result of the segmentation process.

The segmentation is typically performed independently of the precise optical settings of the stepper or the recipe settings. The segments or other information resulting from the segmentation process can be used to indicate or estimate the complexity of RET to be applied without physically doing or completing the RET. For example, a straight edge with multiple neighboring geometries projected onto it may produce multiple dissected segments, compared to a straight edge isolated from nearby geometry yielding very few segments.

The segmentation techniques can be improved or further refined by infusing more physics into the segmentation criteria. Techniques similar to finite element computation methodology can be applied when a new segment is generated when the objective error (e.g., potential or intensity, etc.) is estimated to exceed a given bound. Likewise, segments can also be removed when the error is under certain given bound to reduce the number of segments for complexity reasons. The full lithographic simulation results may also be incorporated to make the segmentation decision.

Additionally, use of components of the WIMAPS described above improves the segmentation process because "optimal" dissection (or evaluation) points are very important to the accuracy and performance of the prediction. The generation of these points can be performed using the predictive processes of the WIMAPS along with one or more other processes. As an example, when layout geometry allows for evaluation of the corresponding shape printing result, rules can be used to reduce the computation applied to this geometry.

Referring to FIGS. 1-9, the operations of the components or processes are under control of at least one processor, but are not so limited. Those skilled in the relevant art can create source code, microcode, program logic arrays or otherwise implement the WIMAPS based on these flow diagrams and the detailed description provided herein. The algorithm or routine operating according to these flow diagrams can be stored in non-volatile memory that forms part of the associated processors, in the associated memory areas, in removable media, such as disks, or hardwired or preprogrammed in chips, such as electronically erasable programmable ROM ("EEPROM") semiconductor chips, or in any combination of these components, but is not so limited.

Aspects of the WIMAPS, described above, are described in terms of processes that may be executed on an EDA computer system or other processing system. These processes are implemented as program code stored in machine-readable or computer-readable memory areas or devices of a computer system and are executed by the processor of the computer system.

Figure 10:
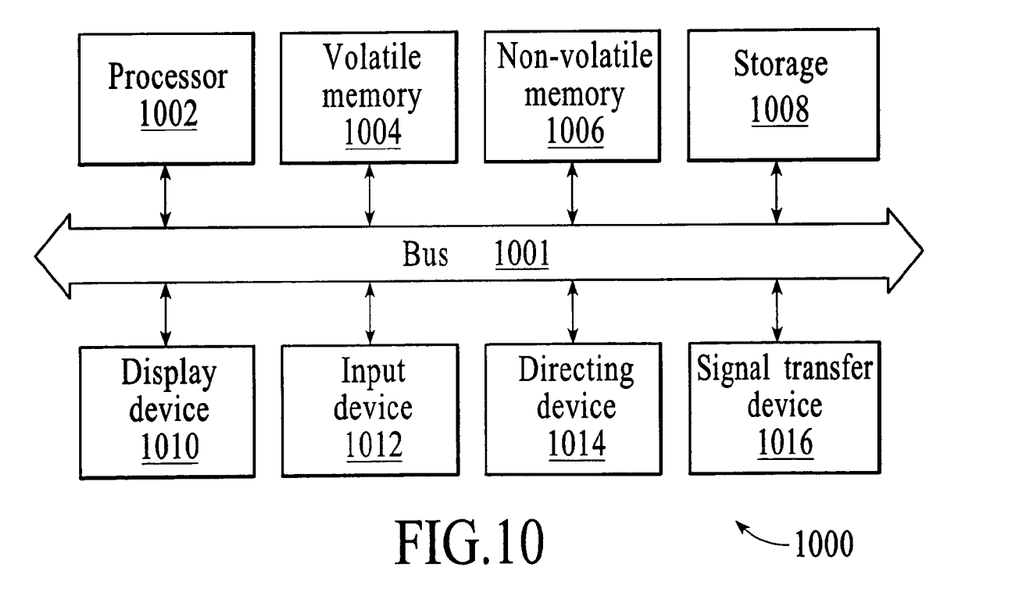
FIG. 10 is a computer system hosting components of a design and/or manufacturing process that includes the WIMAPS, under an embodiment.

Although a variety of different computer systems can be used with the IC fabrication process, FIG. 10 is a computer system 1000 hosting components of a design and/or manufacturing process that includes the WIMAPS, under an embodiment. The computer system 1000 generally includes a central processor unit ("CPU") or central processor 1002 for processing information and instructions, an address/data bus 1001 coupled to the CPU 1002 for communicating information, volatile memory 1004 (random access memory ("RAM") for example) coupled to the bus 1001 for storing information and instructions for the CPU 1002, and non-volatile memory 1006 (read-only memory ("ROM") for example) coupled to the bus 1001 for storing static information and instructions for the CPU 1002. The computer system 1000 may also include one or more optional storage devices 1008 coupled to the bus 1001 for storing information and instructions. The storage devices or data storage devices 1008 can include one or more removable magnetic or optical storage media which are computer-readable memories. Some combination of the volatile memory 1004, non-volatile memory 1006, and/or storage device 1008 include or store data structures describing components or processes of the WIMAPS described above, but the WIMAPS is not limited to storage in these devices.

The computer system 1000 may also include at least one optional display device 1010 coupled to the bus 1001 for displaying information to the users of the computer system 1000. The computer system 1000 of an embodiment may also include one or more optional input devices 1012 coupled to the bus 1001 for communicating information and command selections to the CPU 1002. Additionally, the computer system 1000 may include an optional cursor control or directing device 1014 coupled to the bus 1001 for communicating user input information and command selections to the CPU 1002. The computer system 1000 may also include one or more optional signal transfer devices 1016 (transmitter, receiver, modem, etc. for example) coupled to the bus 1001 for interfacing with other computer systems.

The WIMAPS of an embodiment includes a method comprising at least one of receiving a circuit design that represents at least one circuit, generating an estimated wafer image of the circuit design using a resolution enhancement technology (RET) model, and generating predicted silicon contours corresponding to the circuit design using information of the estimated wafer image, wherein the silicon contours are generated prior to application of at least one of a RET process and a printing process to the circuit design.

The method of an embodiment further comprises identifying errors in the circuit design using at least one of the estimated silicon contours and the predicted wafer image. The identified errors of an embodiment include deviations relating to at least one of pinch/bridge, critical dimensions, contact/via enclosures, gate endcap pullback parameters, and design rule compliance.

The method of an embodiment further comprises at least one of repairing the identified errors in the circuit design, and providing a repaired circuit design.

Repairing of an embodiment further comprises generating candidate repairs corresponding to the identified errors using at least one repair guideline. Repairing of an embodiment further comprises determining an impact of at least one segment of neighboring circuitry on the identified error, wherein the neighboring circuitry is adjacent the identified error in the circuit design.

The method of an embodiment further comprises assigning a score to the candidate repairs, wherein the score indicates a level of acceptability of a corresponding candidate repair. The method of an embodiment further comprises at least one of determining when the score is below a pre-specified threshold, and generating at least one additional candidate repair that corresponds to the identified errors when the score is below the pre-specified threshold.

The method of an embodiment further comprises transferring the repaired circuit design to at least one integrated circuit manufacturing process.

The method of an embodiment further comprises at least one of generating an estimated wafer image of the repaired circuit design using the resolution enhancement technology (RET) model, generating predicted silicon contours corresponding to the repaired circuit design using information of the estimated wafer image, identifying errors in the repaired circuit design using at least one of the estimated silicon contours and the predicted wafer image, repairing the identified errors in the repaired circuit design, and providing another repaired circuit design.

The method of an embodiment further comprises outputting information of the identified errors to a user, wherein the output information of the identified errors includes at least one of text file and markers of a layer file.

The RET model of an embodiment is derived from at least one optimization problem representing at least one of a RET process and a printing process, wherein the RET process is subsequently performed on the circuit design during manufacturing of semiconductor chips that include the circuit. The optimization of an embodiment is a convex optimization. The optimization of an embodiment represents at least one inversion of at least one of the RET process and the printing process.

Generating estimated silicon contours of an embodiment includes generating at least one prediction of at least one factor of the circuit design as applied to a silicon wafer, wherein the factors includes at least one of contour factors, hot spots, sensitivity, mask error enhancement-factor, and normalized image log-slope.

The WIMAPS of an embodiment includes a device comprising at least one of means for receiving a circuit design that represents at least one circuit, means for generating an estimated wafer image of the circuit design using a resolution enhancement technology (RET) model, and means for generating predicted silicon contours corresponding to the circuit design using information of the estimated wafer image, wherein the silicon contours are generated prior to application of at least one of a RET process and a printing process to the circuit design.

The device of an embodiment further comprises means for identifying errors in the circuit design using at least one of the estimated silicon contours and the predicted wafer image.

The device of an embodiment further comprises means for repairing the identified errors in the circuit design and providing a repaired circuit design, wherein repairing further comprises iteratively generating candidate repairs corresponding to the identified errors using at least one repair guideline.

The device of an embodiment further comprises at least one of means for assigning a score to the candidate repairs, wherein the score indicates a level of acceptability of a corresponding candidate repair, and means for generating at least one additional candidate repair that corresponds to the identified errors when the score is below a pre-specified threshold.

The RET model of an embodiment is derived from at least one optimization problem representing at least one of a RET process and a printing process, wherein the RET process is subsequently performed on the circuit design during manufacturing of semiconductor chips that include the circuit. The optimization of an embodiment represents at least one inversion of at least one of the RET process and the printing process. The optimization of an embodiment is a convex optimization.

The WIMAPS of an embodiment includes a machine readable medium including executable instructions which when executed by a processing system receives a circuit design that represents at least one circuit, generates an estimated wafer image of the circuit design using a resolution enhancement technology (RET) model, and/or generates predicted silicon contours corresponding to the circuit design using information of the estimated wafer image, wherein the silicon contours are generated prior to application of at least one of a RET process and a printing process to the circuit design.

The processing system of an embodiment further identifies errors in the circuit design using at least one of the estimated silicon contours and the predicted wafer image.

The processing system of an embodiment further repairs the identified errors in the circuit design and provides a repaired circuit design, wherein in repairing the processing system iteratively generates candidate repairs corresponding to the identified errors using at least one repair guideline.

The processing system of an embodiment further assigns a score to the candidate repairs, wherein the score indicates a level of acceptability of a corresponding candidate repair, and/or generates at least one additional candidate repair that corresponds to the identified errors when the score is below a pre-specified threshold.

The RET model of an embodiment is derived from at least one optimization problem representing at least one of a RET process and a printing process, wherein the RET process is subsequently performed on the circuit design during manufacturing of semiconductor chips that include the circuit. The optimization of an embodiment represents at least one inversion of at least one of the RET process and the printing process. The optimization of an embodiment is a convex optimization.

Aspects of the systems and methods for fabricating ICs described herein may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the systems and methods for fabricating ICs include: microcontrollers with memory (such as electronically erasable programmable read only memory (EEPROM)), embedded microprocessors, firmware, software, etc. Furthermore, aspects of the systems and methods for fabricating ICs may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

It should be noted that components of the various systems and methods disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages.

Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). When received within a computer system via one or more computer-readable media, such data and/or instruction-based expressions of the above described systems and methods may be processed by a processing entity (e.g., one or more processors) within the computer system in conjunction with execution of one or more other computer programs including, without limitation, net-list generation programs, place and route programs and the like.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the systems and methods for fabricating ICs is not intended to be exhaustive or to limit the systems and methods for fabricating ICs to the precise form disclosed. While specific embodiments of, and examples for, the systems and methods for fabricating ICs are described herein for illustrative purposes, various equivalent modifications are possible within the scope of the systems and methods for fabricating ICs, as those skilled in the relevant art will recognize. The teachings of the systems and methods for fabricating ICs provided herein can be applied to other processing systems and methods, not only for the systems and methods for fabricating ICs described above.

The elements and acts of the various embodiments described above can be combined to provide further embodiments. These and other changes can be made to the systems and methods for fabricating ICs in light of the above detailed description.

In general, in the following claims, the terms used should not be construed to limit the systems and methods for fabricating ICs to the specific embodiments disclosed in the specification and the claims, but should be construed to include all systems and methods that operate under the claims. Accordingly, the systems and methods for fabricating ICs are not limited by the disclosure, but instead the scope of the systems and methods for fabricating ICs are to be determined entirely by the claims.

While certain aspects of the systems and methods for fabricating ICs are presented below in certain claim forms, the inventors contemplate the various aspects of the systems and methods for fabricating ICs in any number of claim forms. For example, while only one aspect of the system is recited as embodied in machine-readable medium, other aspects may likewise be embodied in machine-readable medium. Accordingly, the inventors reserve the right to add additional claims after filing the application to pursue such additional claim forms for other aspects of the systems and methods for fabricating ICs.

What is claimed is:

1. A method for compensating dimensional variations between a contour of a predicted wafer contour model and an as-designed contour of a circuit design layout comprising:
   generating, via a computer system, a wafer printing model from the circuit design layout using a resolution enhancement technology (RET) model;
   generating an inverse RET model from the wafer printing model, wherein the inverse RET model is an approximate inverse of the wafer printing model;
   generating the predicted wafer contour model by combining the inverse RET model with the wafer printing model;
   determining a difference of a lateral dimension of the contour of the predicted wafer contour model and the as-designed contour of the circuit design layout, wherein the lateral dimension is parallel to a wafer surface of the predicted wafer; and
   modifying the circuit design layout to reduce the difference in the lateral dimension.

2. The method of claim 1, wherein the difference in lateral dimension comprises a lateral dimension deviation of two critical dimensions.

3. The method of claim 2, wherein the critical dimension comprises a distance between bridges, a via enclosure dimension, or a gate endcap pullback dimension.

4. The method of claim 1, wherein the determining further comprises minimizing a difference of a hot spots, sensitivity, mask error enhancement-factor, and normalized image log slope between the predicted wafer contour model and the as-designed contour of the circuit design layout.

5. The method of claim 4, wherein the minimizing is a non-linear optimization problem.

6. The method of claim 1, wherein the predicted wafer contour model is represented by an expression $$P*P^{-1},$$

wherein P is the wafer printing model and $P^{-1}$ is the inverse RET model.

7. The method of claim 6, wherein the predicted wafer contour model is represented by an expression $$|P*P^{-1}-I|,$$

wherein I is an identity model representing an as-designed circuit layout.

8. The method of claim 6, wherein the predicted wafer contour model is represented by an expression $$|P*P^{-1}-I|+\mu|P*P^{-1}d-s|,$$

wherein $\mu$ is a weighting variable, d is a lateral dimension of a contour of the predicted wafer contour model, and s is a measured lateral dimension of an actual silicon contour.

9. A method for compensating lithographic variations comprising:
generating, via a computer system, a predicted wafer contour model by combining an inverse RET model with a wafer printing model, wherein the inverse RET model is an approximate inverse of the wafer printing model, wherein the predicted wafer contour model is represented by an expression $P*P^{-1}$, wherein P comprises the wafer printing model and $P^{-1}$ comprises the inverse of the wafer printing model;
minimizing a difference equation represented by an expression $|P*P^{-1}-I|$, wherein I comprises an as intended circuit contour model, and wherein $|P*P^{-1}-I|$ comprises a variation between a first lateral dimension of the predicted wafer contour model and a second lateral dimension of the as intended circuit contour model; and
modifying the inverse of the wafer printing model, $P^{-1}$, based on the minimization.

10. The method of claim 9, further comprising:
generating the wafer printing model from a circuit design layout using a resolution enhancement technology (RET) model; and
generating the inverse of the wafer printing model from the wafer printing model.

11. The method of claim 9, wherein the variation comprises a lateral dimension deviation of two critical dimensions.

12. The method of claim 11, wherein the critical dimension comprises one or more of a distance between bridges, a via enclosure dimension, and a gate endcap pullback dimension.

13. The method of claim 9, wherein the difference equation is represented by an expression $$|P*P^{-1}-I|+\mu|P*P^{-1}d-s|,$$

wherein $\mu$ is a weighting variable, d is a lateral dimension of a contour of the predicted wafer contour model, and s is a measured lateral dimension of an actual silicon contour.

14. A method, comprising:
determining a RET process model and a wafer printing process model for a semiconductor fabrication process;
determining, via a computer system, an inverse of the RET process model and combining the inverse of the RET process model with the printing process model to generate a lumped process model, wherein the inverse RET model is an approximate inverse of the wafer printing model;
applying the lumped process model to a circuit to be manufactured using the fabrication process to generate predicted silicon contours for the circuit;
determining a difference of a lateral dimension of the contours predicted silicon contours and an as-designed contour of the circuit design layout, wherein the lateral dimension is parallel to a planar surface of the wafer; and
modifying the circuit design layout to reduce the difference in the lateral dimension.

15. The method of claim 14, wherein the difference in lateral dimension comprises a lateral dimension deviation of two critical dimensions.

16. The method of claim 15, wherein the critical dimension comprises a distance between bridges, a via enclosure dimension, or a gate endcap pullback dimension.

17. The method of claim 14, wherein the determining further comprises minimizing a difference of a hot spots, sensitivity, mask error enhancement-factor, and normalized image log slope between the predicted wafer contour model and the as-designed contour of the circuit design layout.

18. The method of claim 14, wherein the predicted silicon contour model is represented by an expression $$P*P^{-1},$$

wherein P is the wafer printing model and $P^{-1}$ is the inverse RET model.

19. The method of claim 18, wherein the predicted silicon contour model is represented by an expression $$|P*P^{-1}-I|,$$

wherein I is an identity model representing an as-designed circuit layout.

20. The method of claim 19, the predicted silicon contour model is represented by an expression $$|P*P^{-1}-I|+\mu|P*P^{-1}d-s|,$$

wherein $\mu$ is a weighting variable, d is a lateral dimension of a contour of the predicted silicon contour model, and s is a measured lateral dimension of an actual silicon contour.

* * * * *

UNITED STATES PATENT AND TRADEMARK OFFICE
CERTIFICATE OF CORRECTION

PATENT NO. : 7,653,890 B2
APPLICATION NO. : 11/096469
DATED : January 26, 2010
INVENTOR(S) : Chi-Ming Tsai et al.

It is certified that error appears in the above-identified patent and that said Letters Patent is hereby corrected as shown below:

Column 18, lines 11-28, Claim 14 should read as follows:

A method, comprising:
determining, via a computer system, a RET process model and a wafer printing process model for a semiconductor fabrication process; determining an inverse of the RET process model and combining the inverse of the RET process model with the printing process model to generate a lumped process model, wherein the inverse RET model is an approximate inverse of the wafer printing model; applying the lumped process model to a circuit to be manufactured using the fabrication process to generate predicted silicon contours for the circuit; determining a difference of a lateral dimension of the contours predicted silicon contours and an as-designed contour of the circuit design layout, wherein the lateral dimension is parallel to a planar surface of the wafer; and modifying the circuit design layout to reduce the difference in the lateral dimension.

Signed and Sealed this

Fourth Day of May, 2010

David J. Kappos
*Director of the United States Patent and Trademark Office*